(12) United States Patent
Kim et al.

(10) Patent No.: US 7,041,592 B2
(45) Date of Patent: May 9, 2006

(54) METHOD FOR FORMING A METAL INTERCONNECTION LAYER OF A SEMICONDUCTOR DEVICE USING A MODIFIED DUAL DAMASCENE PROCESS

(75) Inventors: Jae-hak Kim, Kyungki-do (KR); Soo-geun Lee, Suwon (KR); Kyung-woo Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/449,973

(22) Filed: May 30, 2003

(65) Prior Publication Data

US 2004/0038521 A1    Feb. 26, 2004

(30) Foreign Application Priority Data

Aug. 1, 2002    (KR) ............... 10-2002-0045610

(51) Int. Cl.
*H01L 21/4763* (2006.01)

(52) U.S. Cl. ............ 438/618; 438/633; 438/634; 438/638; 438/672

(58) Field of Classification Search ........... 438/618, 438/633, 634, 638, 672, FOR. 355, FOR. 489
See application file for complete search history.

(56) References Cited

U.S. PATENT DOCUMENTS

| | | | |
|---|---|---|---|
| 6,358,842 B1* | 3/2002 | Zhou et al. | 438/633 |
| 6,528,409 B1* | 3/2003 | Lopatin et al. | 438/618 |
| 6,551,915 B1* | 4/2003 | Lin et al. | 438/598 |
| 6,627,532 B1* | 9/2003 | Gaillard et al. | 438/623 |
| 2001/0051420 A1* | 12/2001 | Besser et al. | 438/597 |
| 2002/0016058 A1* | 2/2002 | Zhao | 438/619 |
| 2002/0173143 A1* | 11/2002 | Lee et al. | 438/637 |
| 2003/0082905 A1* | 5/2003 | Hung et al. | 438/633 |

* cited by examiner

*Primary Examiner*—George Fourson
*Assistant Examiner*—Fernando L. Toledo
(74) *Attorney, Agent, or Firm*—F. Chau & Associates, LLC

(57) ABSTRACT

A method for forming a metal interconnection layer of a semiconductor device comprises forming a film including a material selective to a medium used in an ashing process on an interlayer insulating film. The method comprises transforming the film during the ashing process to form an interconnection pattern having a dual damascene structure. A dielectric material such as copper is deposited on the interconnection pattern, which is planarized through CMP, thereby forming a via contact having a single damascene structure without a recess therein.

23 Claims, 6 Drawing Sheets

METHOD FOR FORMING A METAL INTERCONNECTION LAYER OF A SEMICONDUCTOR DEVICE USING A MODIFIED DUAL DAMASCENE PROCESS

BACKGROUND OF THE INVENTION

1. Field of the Invention

The present invention relates to a method for forming a metal interconnection layer of a semiconductor device, and more particular to, a method for forming a metal interconnection layer of a semiconductor device having a via contact of a single damascene structure by using a modified dual damascene process.

2. Description of the Related Art

As semiconductor device integration increases, distances between metal interconnection layers decrease, resulting in a need for a metal interconnection layer having a multi-layered interconnection structure. Multi-layered interconnection structures are affected by the problems of parasitic capacitance (C) and parasitic resistance (R) between adjacent metal interconnection layers in the same layer or between vertically adjacent interconnection layers.

Parasitic capacitance (C) and parasitic resistance (R) in the metal interconnection system induce parasitic RC delay, and therefore, reduce the operational speed of the semiconductor device. Further, parasitic capacitance (C) and parasitic resistance (R) increase the amount of current leakage and the overall power consumption of a chip. Therefore, it is important that a multi-layered interconnection technology have a low parasitic RC when implemented in a high-speed and high-integrated semiconductor device.

To form an interconnection having a low parasitic RC, a metal having a low resistivity is needed as an interconnection material, or a dielectric film is needed with a material of a low dielectric constant. For example, materials such as copper (Cu), aluminum (Al), silver (Ag), gold (Au), including their alloys, and the like, are possible interconnection materials.

Among these materials, copper benefits from low price and low process load as well as low resistivity. Moreover, in contrast to aluminum, copper has a greater tolerance against electro-migration.

The advantages of copper have resulted in copper being widely used as an interconnection material. However, when an interconnection of a final interconnection layer is formed of copper, an aluminum bounding pad is needed. If the interconnection of the final interconnection layer is formed of aluminum, the additional formation of the aluminum bonding pad is not needed.

However, via contacts connecting an interconnection of the final interconnection layer and an electric conductor formed in a lower layer of the final interconnection layer are typically made of copper. That is, single damascene structures, which are typically used for via contacts, are made of copper.

Single damascene structure via contacts formed by using copper are also widely used in structures connecting upper conductors and lower conductors. In addition, as the number of interconnection layers increases with the degree of integration, the number of contacts connecting upper interconnections and lower interconnections, and the depth of the contacts, increases.

Copper has a chemical affinity with other materials, and thus easily spreads into a silicon substrate or a silicon oxide film. To prevent copper from spreading and to improve an adhesive force, a method of forming a barrier layer, made of metal alloys comprising titanium or a tantalum series, between the contact and the silicon oxide film is typically used.

Further, copper has a high degree of oxidation and is easily oxidized when exposed to air. Oxidation of copper increases an interconnection resistance and stress, and negatively affects electronic characteristics of the chip. Therefore, an oxidation prevention film is formed on the outside of copper interconnection layer so as to prevent the oxidation of the copper.

In addition, a damascene process can be used for forming an interconnection pattern of copper rather than an etch. This is because copper is difficult to etch. The damascene process can be a single damascene process or a dual damascene process. In the damascene process, a planarization process is needed to remove a copper film. For a via contact formed using copper, recesses occurring in the via contact are a problem caused by different etching rates of the via contact metal and surrounding materials during the planarization process.

FIG. 1 is a graph showing recess depths in the via contact after a chemical mechanical polishing (hereinafter referred to as "CMP") according to a distance to an adjacent via pattern.

As shown in the graph, if copper is deposited and then the CMP process is performed, a recess occurs to a certain depth in the via contact. Further, the more isolated a via contact is from an adjacent pattern, the deeper the recess is formed in comparison to a recess formed in a via contact that is close to an adjacent pattern.

As described above, if a recess occurs in the via contact, resistance increases, and the characteristics of the device are degraded. Also, where a recess is sufficiently deep in the via contact, for example, where the via contact is isolated from an adjacent pattern, an upper interconnection may be disconnected from a lower interconnection. In this case, faulty interconnections may occur.

Therefore, a need exists for a method for forming a metal interconnection layer of a semiconductor device that substantially prevents a recess from forming in a via contact.

SUMMARY OF THE INVENTION

It is an object of the present invention to provide a method for forming a metal interconnection layer of a semiconductor device wherein a recess is not formed in a via contact.

According to an embodiment of the present invention, a method for forming a metal interconnection layer of a semiconductor device comprises causing a chemical reaction between a medium used for an ashing process and a material included in a lower portion of a photoresist film. The method comprises forming a via hole of a dual damascene structure and an opening by removing a transformed film via the chemical reaction. A dielectric material such as copper is deposited in the via hole and the opening, and a via contact of a single damascene structure is formed by planarizing the via hole and the opening in which copper was deposited.

According to an embodiment of the present invention, a method for forming a metal interconnection layer of a semiconductor device comprises sequentially forming a first interlayer insulating film, a first material film including a material having a high reactivity to an medium used for removing a photoresist, and a second material film, on a semiconductor substrate in which a conductive layer is formed, forming a photoresist film having a pattern exposing an upper portion of the second material film, forming a via hole by etching the second material film, the first material film, and the first interlayer insulating film, using the photoresist film as an etch mask, and transforming a portion of the first material film exposed to the via hole by reacting with the medium used for removing the photoresist and removing the photoresist film substantially simultaneously. The method further comprises forming an opening wider than the via hole in the first material film by removing the transformed first material film, removing the remaining second material film, depositing a metal material to fill the via hole and the opening and forming a via contact by performing a planarization process until the first interlayer insulating film is exposed.

Here, the metal material may include copper. The first material film has a high selectivity to oxygen or oxygen ions.

The step of removing the photoresist is performed using oxygen plasma discharge or using ozone. The first material film has a high selectivity to oxygen or oxygen ions.

The method further comprises, after forming the via contact, forming an interconnection layer including an interconnection pattern connected to the via contact on the resultant structure of forming the via contact and a second interlayer insulating film surrounding the interconnection pattern. The interconnection layer is a final interconnection layer. The interconnection pattern of the final interconnection layer comprises aluminum.

The method further comprises, before forming the first insulating film, forming an etch stopping layer on the semiconductor substrate and etching the etch stopping layer exposed to the via hole. Here, the interconnection pattern of the interconnection layer comprises aluminum.

The second material film comprises a SiON film, a silicon oxide film, a silicon nitride film, a silicon carbide film, a polysilicon film, a metal oxide film, or a film having a metal nitride material.

The via contact is formed where density of patterns that is adjacent to the via contact is relatively low.

The method further comprises, before forming the first insulating film, forming an etch stopping layer on the semiconductor substrate and etching the etch stopping layer exposed to the via hole.

The method further comprises, before depositing the metal material, forming a diffusion barrier on the first interlayer insulating film exposed to the via hole.

According to an embodiment of the present invention, a method for forming a metal interconnection layer of a semiconductor device comprises sequentially forming a first interconnection insulating film and a first material film including a material reacting to a medium used for removing the photoresist, forming a photoresist film having a pattern exposing an upper portion of the first material film, on the first material film, and forming a via hole by etching the first material film and the first interlayer insulating film. The method comprises transforming a portion of the first material film exposed to the via hole by reacting with the medium used for removing the photoresist and removing the photoresist film substantially simultaneously. The method further comprises forming an opening wider than the via hole in the first material film by removing the transformed first material film, depositing a metal material to fill the via hole and the opening, and forming a via contact by performing a planarization process until the first interlayer insulating film is exposed.

Here, the metal material comprises copper. The first material film has have a high selectivity to oxygen or oxygen ions.

The method of removing the photoresist is performed using oxygen plasma discharge or using ozone. The first material film has a high selectivity to oxygen or oxygen ions.

The method further comprises, after forming the via contact, forming an interconnection pattern contacting the via contact and an interconnection layer surrounding the interconnection pattern, on the resultant structure. The interconnection layer is a final interconnection layer, and the interconnection pattern of the final interconnection layer comprises aluminum.

The via contact is formed where density of patterns that is adjacent to the via contact is relatively low.

The method further comprises, before forming the first insulating film, forming an etch stopping layer on the semiconductor substrate and etching the etch stopping layer exposed to the via hole.

The method further comprises, before depositing the metal material, forming a diffusion barrier on the first interlayer insulating film exposed to the via hole.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1:
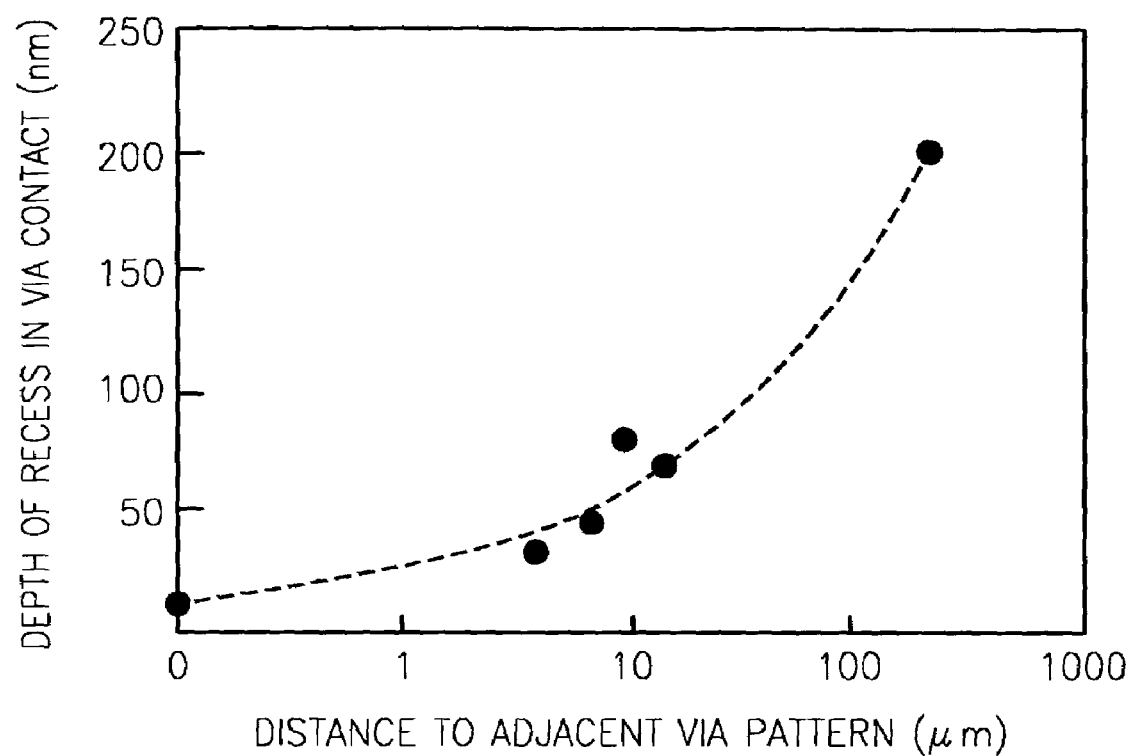
FIG. 1 is a graph showing depth of recess in a via contact after a CMP process according to changes in distance to an adjacent via pattern.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

FIGS. 2 through 8 are sectional views showing a method for forming an interconnection layer of a semiconductor device according to an embodiment of the present invention.

Figure 2:
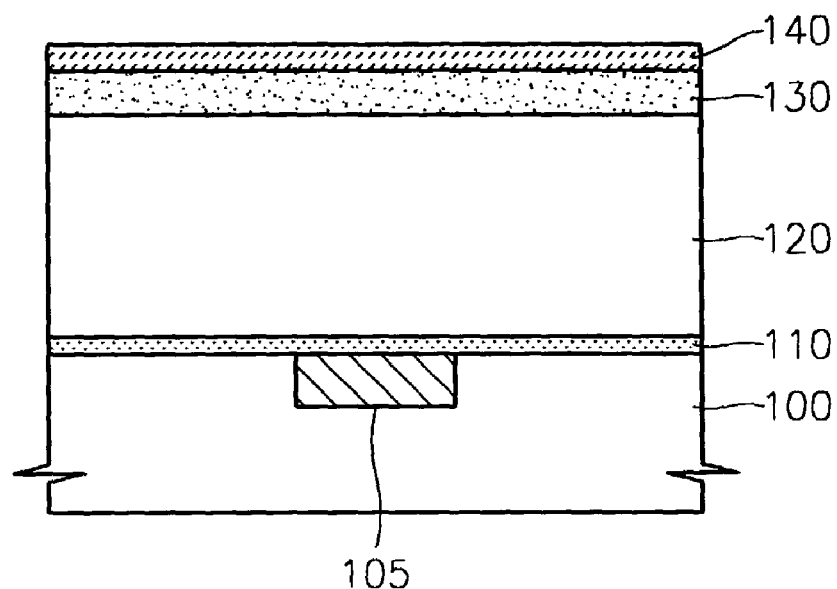
FIGS. 2 through 8 are sectional views showing a method for forming an interconnection layer of a semiconductor device according to an embodiment of the present invention.

Referring FIG. 2, a first interlayer insulating film 120, a first material film 130, and a second material film 140 are sequentially deposited on a semiconductor substrate 100 including a conductive layer 105.

Here, the semiconductor substrate 100 can be a silicon wafer substrate or a layer of another material that includes the conductive layer 105 therein. The conductive layer 105 can be an impurity doping region copper (Cu) interconnection layer or other conductive material pattern formed in the semiconductor substrate 100.

An etch stopping layer 110 can be deposited on the semiconductor substrate 100 before the first interlayer insulating film 120 is deposited. It is desirable that the etch stopping layer 110 be formed of a material having a high etch selectivity to the first interlayer insulating film 120, for example, formed of a silicon nitride ($Si_3N_4$) film or a silicon carbide (SiC) film. The etch stopping layer 110 is formed to have a thickness of about 200 Å–1000 Å, preferably, 500 Å.

The first interlayer insulating film 120 deposited on the etch stopping layer 110 is preferably formed of a material film having a low conductivity, for example, a porous silicon oxide film, a phosphorous silicate glass (PSG) film, a boron phosphorous silicate glass (BPSG) film, an undoped silicate glass (USG) film, a fluorine doped silicate glass (FSG) film, a SiOC film, a high-density plasma (HDP) film, a plasma-enhanced tetraethylorthosilicate (PE-TEOS) film, or a spin-on glass (SOG) film. The first interlayer insulating film 120 is formed to have a thickness of about 1500 Å–15000 Å, preferably, about 3000 Å–5000 Å.

The first material film 130, deposited on the first interlayer insulating film 120, preferably includes a material having a high selectivity to a medium used in a subsequent ashing process for removing a photoresist film. For example, if oxygen or ozone is used as the medium in the ashing process, it is preferable that the first material film 130 be formed of an oxide film doped with carbon impurities, such as Black Diamond of AMT Corp., Coral of Novellus, or Aurora of ASM. The first material film 130 is formed to have a thickness of about 500 Å–3000 Å, preferably, about 1500 Å.

The second material film 140 does not include a material reactive to a medium used in the ashing process. However, if the second material film 140 includes the material reactive to the medium used in the ashing process, the material reacts to the medium at a slow reaction rate as compared to the first material film 130. For example, as described above, if oxygen or ozone is used as the medium in the ashing process, the second material film 140 can be a SiON film, a silicon oxide film, a silicon nitride film, a silicon carbide film, a polysilicon film, a metal oxide film, or a film of a metal nitride material. The second material film 140 is formed to have a thickness of about 200 Å–1500 Å, preferably, about 5000 Å–1000 Å.

Figure 3:
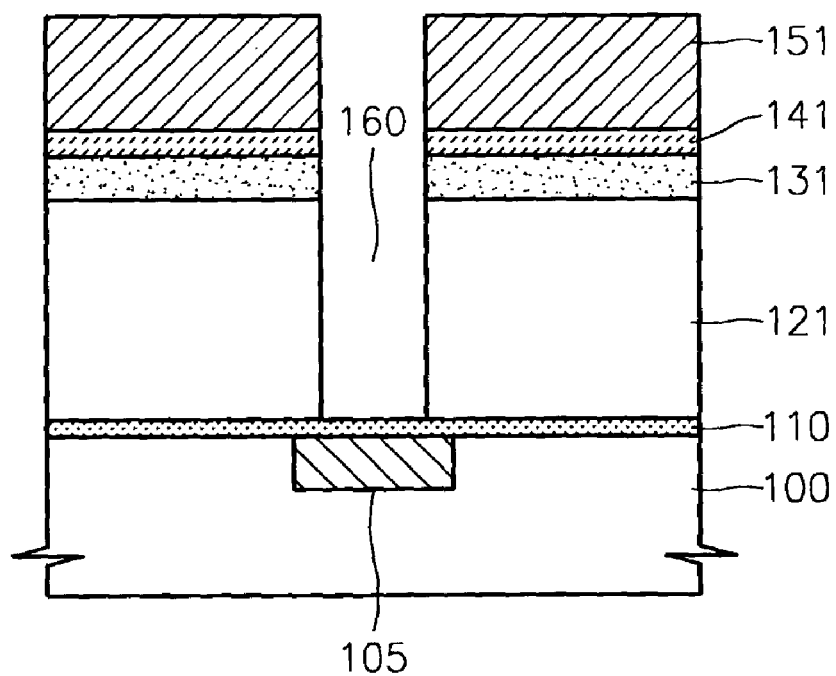

Referring FIG. 3, a photoresist film is deposited on the second material film 140, and a pattern of a region where a via hole 160 is to be formed is generated by using an exposure process and a developing process. In FIG. 3, a photoresist pattern 151 is illustrated. This is useful where patterns of other conductive layers are absent in a region adjacent to the via hole 160. A case where there exist no patterns near the via hole 160 is illustrated in FIG. 3. However, the photoresist pattern 151 can also be applied to a case where many conductive material patterns are formed in the region adjacent to the via hole 160, and thus the density of patterns is relatively high.

A second material pattern 141, a first material film pattern 131, and a first interlayer insulating film pattern 121 are formed by etching the second material film 140, the first material film 130, and the first interlayer insulating film 120, respectively, using the photoresist pattern 151 as an etch mask. The via hole 160 is formed in a predetermined position of the first interlayer insulating film 120. Since a region surrounded by the first material film pattern 131 and the second material film pattern 141 is removed in a subsequent process, the via hole 160 substantially denotes a region surrounded by the first interlayer insulating film 121.

Here, in the process of etching the first interlayer insulating film 120 and forming the first interlayer insulating film pattern 121, the second material film pattern 141 can be used as an etch mask. In this case, only the second material film 140 is etched to form the second material film pattern 141, the photoresist film pattern 151 is removed, and the first interlayer insulating film 120 is etched. Since a process of forming the first interlayer insulating pattern 121 is performed after the photoresist film pattern 151 is removed, the etching is performed after a part of the first material film pattern 131 is transformed.

Figure 4:
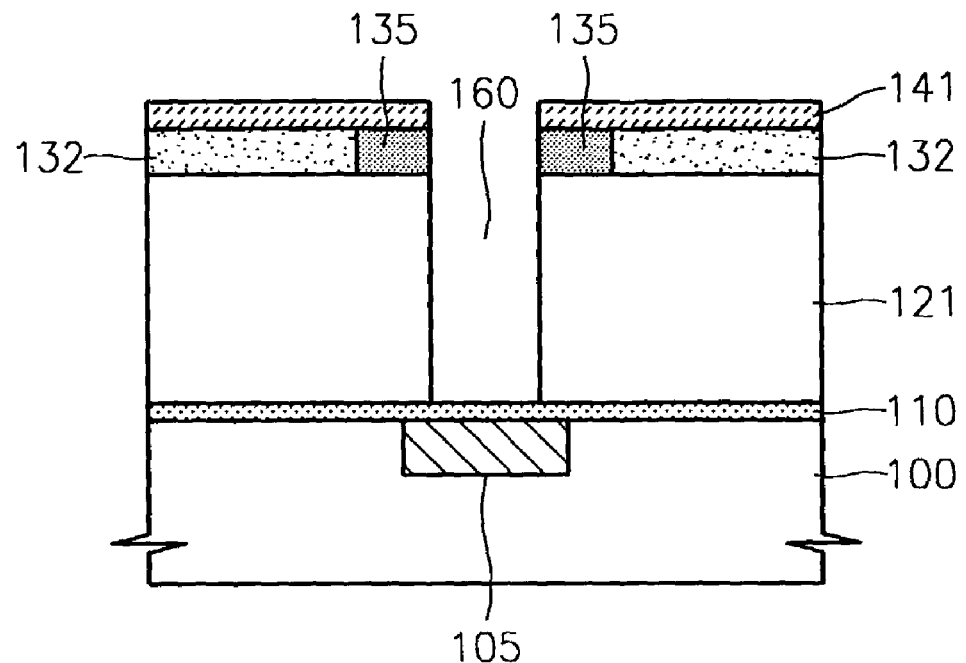

Referring FIG. 4, the photoresist film pattern 151 is removed. An ashing process, for example, a dry ashing process, can be used to remove the photoresist film pattern 151.

A dry ashing process can be a method using oxygen plasma discharge or a method using ozone. The method using oxygen plasma discharge is a method where a by-product of oxygen plasma, e.g., oxygen radicals and an organic material or photoresist, react together to create carbon dioxide, and the carbon dioxide is exhausted via a vacuum pump. The method using ozone is a method where the photoresist is removed under atmospheric pressure by using a strong oxidization of ozone. The ashing process presented herein is not restricted to the above examples, and other ashing process can be used in this embodiment.

During the ashing process, the first material film pattern 131 contacts an ashing medium, which is exposed to the via hole 160. Since the first material film pattern 131 includes impurities with a high selectivity to the ashing medium, the ashing medium reacts with the impurities during the ashing process. Once the reaction occurs, a portion of the first material film pattern is transformed, leaving a transformed first material film 135 and a first material film pattern 132 on the first interlayer insulating film 120.

If the first material pattern 131 is formed of a silicon oxide film doped with carbon impurities, the carbon impurities react with oxygen during an ashing process that uses oxygen plasma or ozone. Then, the carbon dioxide is created and emitted from a portion of the first material film pattern 131. The physical characteristics of the first material film pattern 131, from which carbon dioxide is emitted, are transformed. Then, the transformed first material film 135 can be selectively removed. By utilizing such a chemical reaction, it is possible to form an interconnection pattern of a dual damascene structure without adding an additional photoresist process to the method of forming a pattern of a single damascene structure.

Here, the second material film pattern 141 functions to prevent portions of the first material film pattern 131 from reacting with the ashing medium and being transformed. Therefore, preferably the second material film 141 does not to include a material that would react with the ashing medium.

Figure 5:
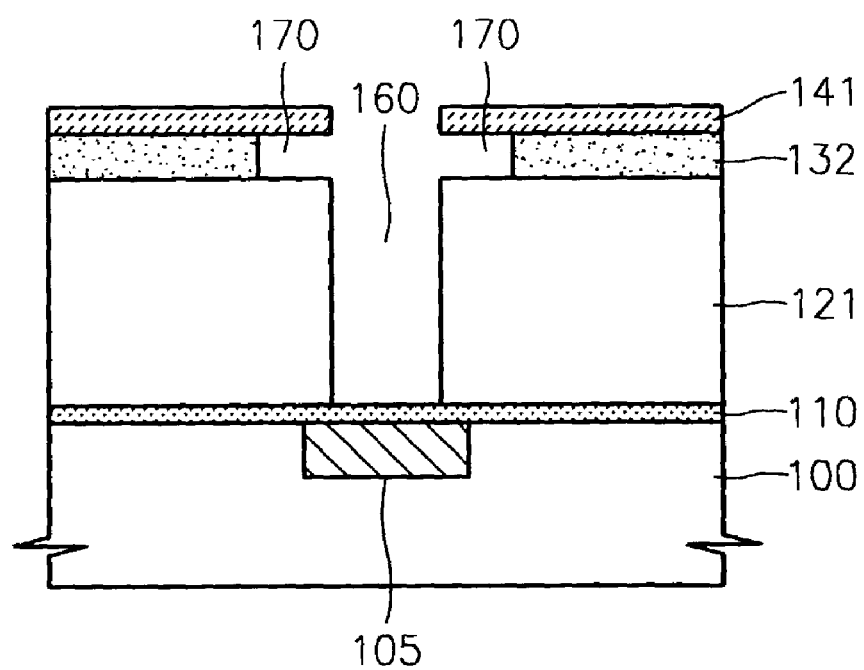

Referring FIG. 5, only the transformed first material film 135 is removed. To remove the transformed first material film 135, dry etching or, preferably, wet etching can be used. Wet etching can use an etching fluid containing fluorine, such as hydrogen fluoride or ammonium fluoride in the above example. However, other etching fluids can be used depending on the physical characteristics of the transformed first material film 135.

After the transformed first material film 135 is removed, an opening 170 surrounded by the first material film pattern 132 is formed on an upper part of the via hole 160. The opening 170 is wider than the via hole 160 and is formed at an entrance to the via hole 160.

Figure 6:
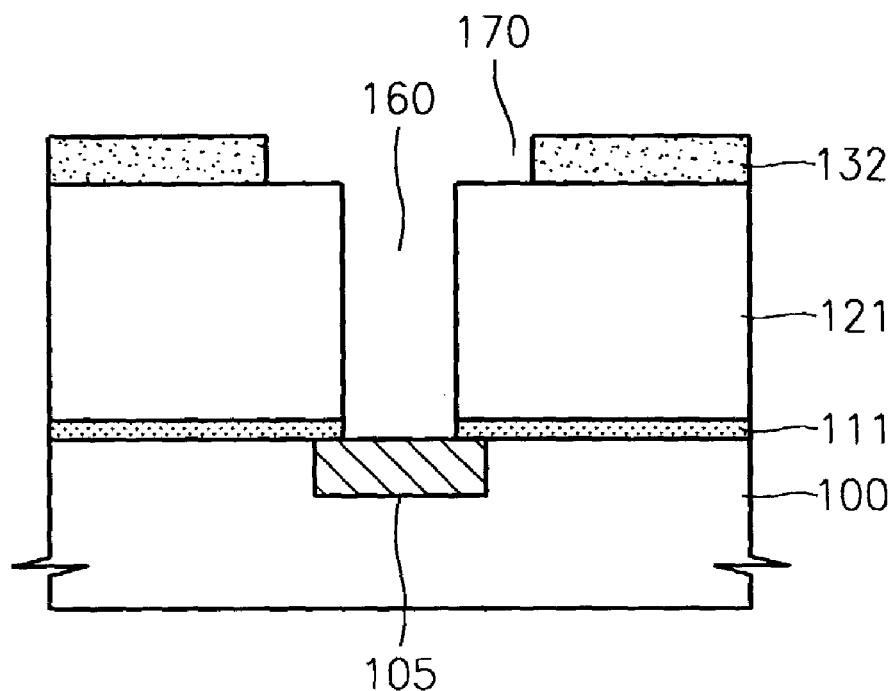

Referring to FIG. 6, the second material film pattern 141 is removed, and the etch stopping layer 110 is exposed by the via hole 160 is removed. The conductive layer 105 is exposed, and an etch stopping layer pattern 111 is formed. The process of removing the second material pattern 141 is preferably performed before the process of etching the etch stopping layer 110. However, considering the thicknesses and etching rates of the second material film 140 and the etch stopping layer 110, both processes can be performed at the same time.

After the second material film pattern 141 and the etch stopping layer 110 are removed, a pattern of a dual damascene structure is formed, surrounded by the first interlayer pattern 121 and the first material pattern 132 as shown in FIG. 6. This pattern of the dual damascene structure is formed by combining the via hole 160 and the opening 170.

Figure 7:
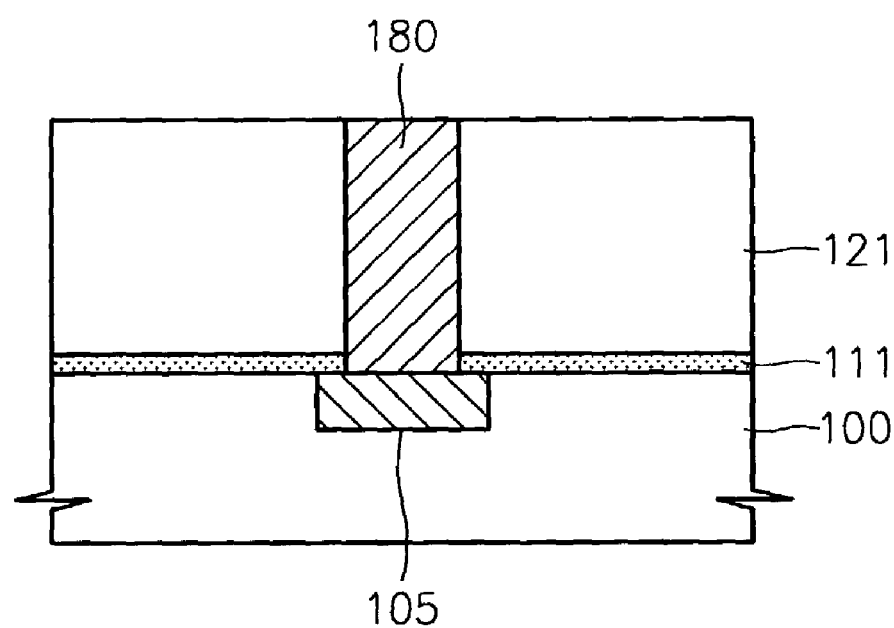

Referring FIG. 7, a resultant structure where a via contact 180 is formed is illustrated. To form the resultant structure, a metal material is deposited in the via hole 160, the opening 170, and on the first material film pattern 132. For the metal material, copper (Cu), silver (Ag), gold (Au), or their alloys, which all have low resistivity, can be used. At this time, it is preferable to form a diffusion barrier on the first material film pattern 132, the via hole 160, and the opening 170 to prevent the metal material from diffusing. For the diffusion barrier, a single layer film such as a film of Ta, TaN, W, WN, Ti, TiN, or a combination film thereof can be used. Preferably, the thickness of the diffusion barrier is about 100 Å–1000 Å.

After the metal material is deposited, the via contact 180 is formed by a planarization process. Here, the CMP can be used. After the metal material, e.g., copper, on the first material film pattern 132 is removed by CMP, the first material film pattern 132 and the metal material in the opening 170 continue to be etched until the first interlayer pattern 121 is exposed. The via contact 180 having a single damascene structure is formed as shown in FIG. 7. CMP is performed to planarize the copper of the dual damascene structure.

If needed, a diffusion barrier is formed on the resultant structure where the via contact 180 is formed. The diffusion barrier can be formed using SiN and SiC or the like. Preferably, the thickness of the diffusion barrier is about 500 Å–1000 Å.

Figure 8:
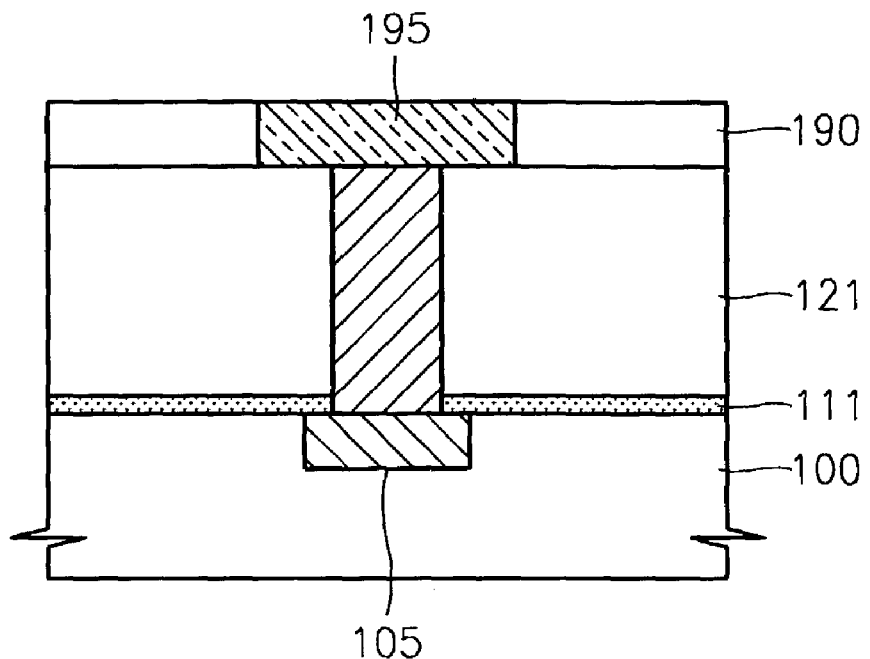

FIG. 8 is a sectional view of a device where an interconnection layer includes an interconnection pattern 195 and a second interlayer insulating film 190 surrounding the interconnection pattern 195. The process of forming the interconnection pattern 195 and a second interlayer insulating film 190 comprises a damascene process of depositing a second interlayer insulating layer, etching a portion of the second interlayer insulating layer in which the interconnection pattern 195 is formed, depositing a material for forming the interconnection pattern 195, and forming the interconnection pattern 195 through CMP or the like. CMP can be used when the interconnection pattern 195 is formed of a different material than the material used for forming the via contact 180, for example, where the interconnection layer is formed of aluminum and the via contact 180 is formed of copper.

However, an embodiment according to the present invention illustrated in FIGS. 2 through 8 is not restricted to the above example, and can be applied to any applications where the via contact 180 of a single damascene structure using copper is needed. In addition, the interconnection layer can be different from that illustrated in the figures in terms of shape or the material used for an interconnection pattern 195 of the interconnection layer.

Figure 9:
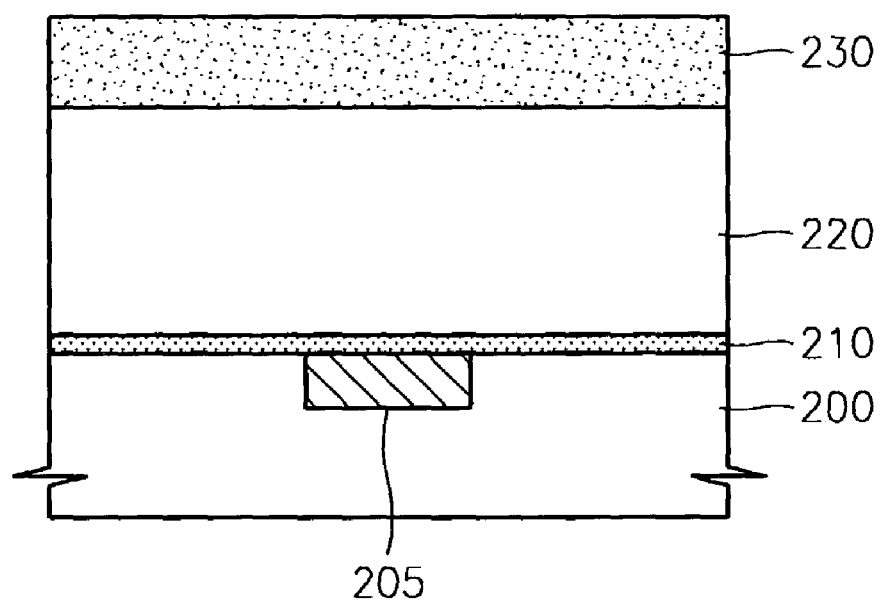
FIGS. 9 through 11 are sectional views showing the method for forming an interconnection layer of a semiconductor device according to an embodiment of the present invention.
Figure 10:
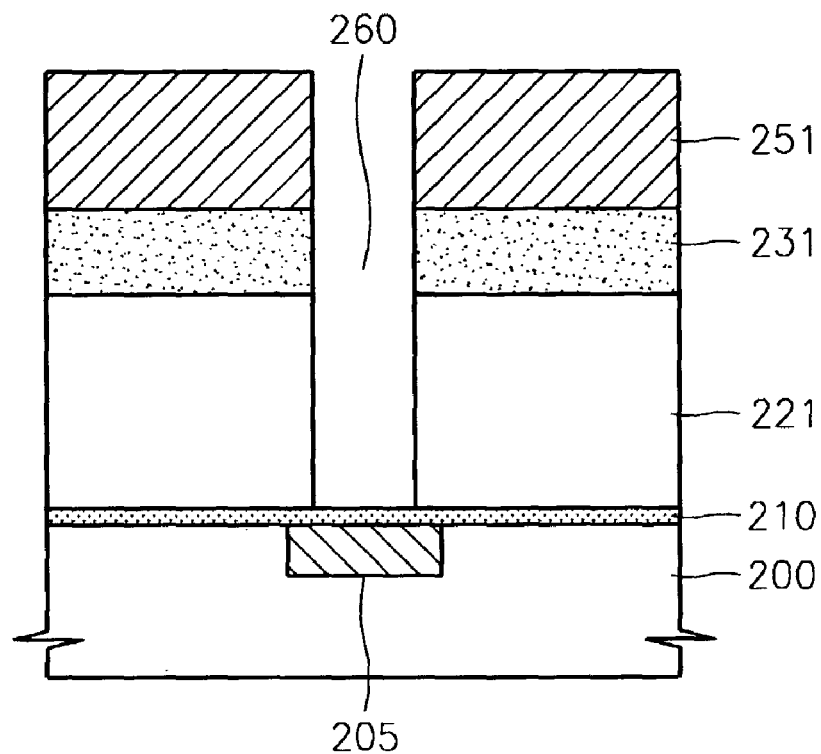
Figure 11:
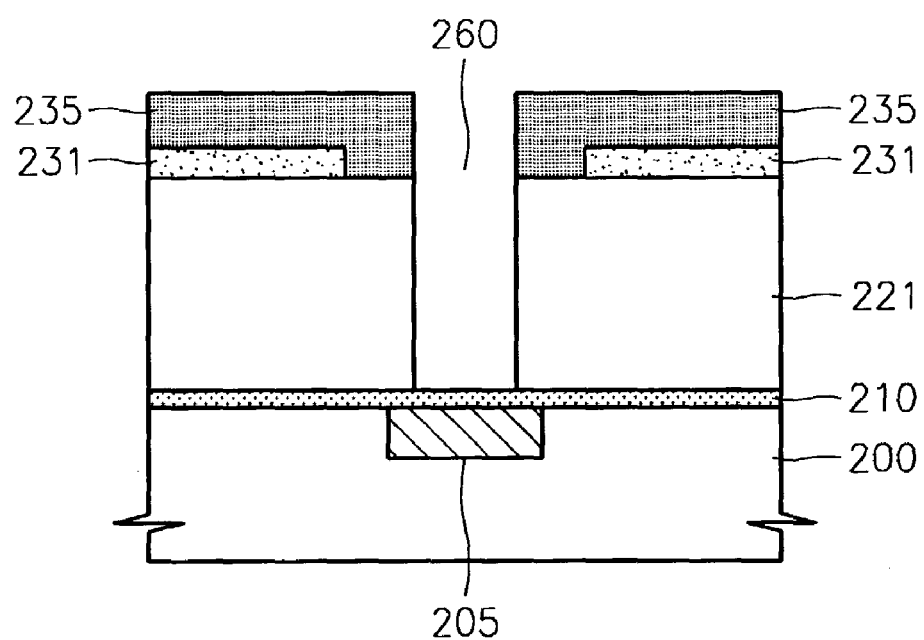

FIGS. 9 through 11 show a method of forming an interconnection layer of a semiconductor device according to an embodiment of the present invention. FIGS. 9 through 11 correspond to FIGS. 2 through 5. The processes illustrated in FIGS. 6 and 7 are applied after the process illustrated in FIG. 11 (however, in this case, the reference numerals are changed so as to be suitable for the description of FIGS. 9 through 11).

Referring FIG. 9, a first interlayer insulating film 220 and a first material film 230 are formed on a semiconductor substrate 200 in which a conductive layer 205 is formed. The semiconductor substrate 200 can be a silicon wafer substrate or a layer of another material, comprising a conductive layer 205 formed therein. The conductive layer 205 can be a impurity doping region, copper interconnection layer, or other conductive material pattern, formed in the semiconductor substrate 200.

An etch stopping layer 210 can be deposited on the semiconductor substrate 200 before the first layer insulating film 220 is deposited. The etch stopping layer 210 is preferably to be formed of a material having a high etch selectivity to the first interlayer insulating film 220 formed in an upper portion of the etch stopping layer 210, for example, formed of a silicon nitride ($Si_3N_4$) or a silicon carbide (SiC) film. The etch stopping layer 210 is formed to have a thickness of about 200 Å–1000 Å, preferably, about 500 Å.

The first interlayer insulating film 220 deposited on the etch stopping layer 210 is preferably formed of a material film having a low dielectric constant, for example, a porous silicon oxidation film, a phosphorous silicate glass (PSG) film, a boron phosphorous silicate glass (BPSG) film, an undoped silicate glass (USG) film, a fluorine doped silicate glass (FSG) film, a SiOC film, a high-density plasma (HDP) film, a plasma-enhanced tetraethylorthosilicate (PE-TEOS) film, or a spin-on glass (SOG) film. The first interlayer insulating film 220 is formed to have a thickness of about 1500 Å–15000 Å, preferably, about 3000 Å–5000 Å.

The first material film 230 deposited on the first interlayer insulating film 220 preferably includes a material having a high selectivity to a medium used in a subsequent ashing process, to remove a photoresist film. For example, if oxygen or ozone is used for the medium in the ashing process, the first material film 230 is preferably formed of an oxide film doped with carbon impurities such as Black Diamond of AMT Corp., Coral of Novellus, or Aurora of ASM. The first material film 230 is formed to have a thickness of about 2000 Å–5000 Å.

Referring FIG. 10, a photoresist film is deposited on the first material film 230, and a photoresist pattern 251 is formed. A via hole 260, defined by the photoresist film pattern 251, is formed by using an exposure process and a developing process. In FIG. 10, the photoresist pattern 251 is illustrated. This is useful where patterns of other conductive layers are absent in a region adjacent to the via hole 260. A case where there exist no patterns near the via hole 260 is illustrated in FIG. 10. However, the photoresist film pattern 251 can also be applied to a case where many conductive material patterns are formed in the region adjacent to the via hole 260, and thus the density of patterns is relatively high.

A first material film pattern 231 and a first interlayer insulating film pattern 221 are formed by etching the first material film 230 and the first interlayer insulating film 220, using the photoresist pattern 251 as an etch mask. The via hole 260 is formed in a predetermined position of the first interlayer insulating film 220. As a result, a via hole 260 in a structure having an etch stopping layer 210 exposes the etch stopping layer 210 whereas a via hole 260 in a structure having no etch stopping layer 210 exposes the conductive layer 205.

Referring to FIG. 11, the photoresist pattern 251 is removed. The dry ashing process can be used as an ashing process to remove the photoresist pattern 251. A method using oxygen plasma discharge or a method using ozone can be utilized as the ashing process.

During the ashing process, an upper portion of the first material film pattern 231 and a portion of the first material film pattern 231 exposed to the via hole 260 contacts an ashing medium. A portion of the impurities included in the first material film pattern 231 react to the ashing medium during ashing process. As a result, a portion of the first material film pattern 231 is transformed into a transformed first material film 235, while another portion of the first material film pattern 232 is left on the first interlayer insulating film pattern 221. As illustrated in FIG. 11, an upper portion of the first material film pattern 231 and the portion of the first material film pattern 231 exposed by the via hole 260 are transformed.

For example, if the first material film pattern 231 is formed of a silicon oxide film doped with carbon impurities, the carbon impurities react with oxygen during an ashing process using oxygen plasma or ozone. Then, carbon dioxide is created and emitted from a portion of the first material film pattern 231. The physical characteristics of the first material film pattern 231, from which carbon dioxide is emitted, are transformed. The transformed first material film 235 can be selectively removed.

It is important to appropriately adjust the conditions of the ashing process. In other words, it is not desirable to form the transformed first material film 235 to the depth of the upper portion of the first interlayer insulating film pattern 221, such that a pattern of a dual damascene structure cannot be formed.

A second material film is not needed, wherein the conditions of the ashing process are adjusted to form the first material film 235 in a portion of the first material film pattern 231. Therefore, it is possible to form an interconnection pattern having a dual damascene structure without adding additional photoresist processes.

The method of forming a via contact having a single damascene structure includes removing the transformed first material film 235, depositing a metal material such as copper, and performing CMP.

According to a method for forming a metal interconnection layer of a semiconductor device, it is possible to form a layer including a pattern of a dual damascene structure by utilizing an ashing process. By etching the interconnection pattern having the dual damascene structure through a planarization process, it is possible to form a via contact having a single damascene structure, in which a recess is not formed. Therefore, electric characteristics of the metal interconnection are improved, and quality semiconductor devices can be easily formed.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a metal interconnection layer of a semiconductor device, the method comprising:

(a) sequentially forming a first interlayer insulating film, a first material film including a material having a high selectivity to a medium used for removing a photoresist film, and a second material film, on a semiconductor substrate in which a conductive layer is formed;
   (b) forming the photoresist film on the second material film having a pattern exposing a portion of the second material film;
   (c) forming a via hole by etching the second material film, the first material film, and the first interlayer insulating film, using the photoresist film as an etch mask;
   (d) transforming a portion of the first material film exposed to the via hole by reacting with the medium used for removing the photoresist film and removing the photoresist film substantially simultaneously;
   (e) forming an opening in the first material film wider than the via hole by removing a transformed portion of the first material film selectively;
   (f) removing the remaining second material film;
   (g) depositing a metal material to fill the via hole and the opening; and
   (h) forming a via contact by planarizing the semiconductor device to the first interlayer insulating film.

2. The method of claim 1, wherein the metal material includes copper.

3. The method of claim 1, wherein the step of removing the photoresist film further comprises one of using oxygen plasma discharge and using ozone.

4. The method of claim 1, wherein the first material film has a high selectivity to oxygen or oxygen ions.

5. The method of claim 4, wherein the first material film is an oxide film doped with carbon.

6. The method of claim 1, wherein the method further comprises, forming an interconnection layer comprising an interconnection pattern connected to the via contact and a second interlayer insulating film surrounding the interconnection pattern.

7. The method of claim 6, wherein the interconnection pattern of the interconnection layer comprises aluminum.

8. The method of claim 1, wherein the second material film comprises a material that is not transformed during the removal of the photoresist film.

9. The method of claim 8, wherein the second material film comprises a material containing a SiON film, a silicon oxide film, a silicon nitride film, a silicon carbide film, a polysilicon film, a metal oxide film, or a film having a metal nitride material.

10. The method of claim 1, wherein the method further comprises:
   forming an etch stopping layer on the semiconductor substrate before forming the first insulating film; and
   etching the etch stopping layer exposed to the via hole before depositing the metal material.

11. The method of claim 1, wherein the method further comprises, forming a diffusion barrier on the first interlayer insulating film exposed to the via hole before depositing the metal material.

12. The method of claim 1, wherein the method further comprises, after step (h), forming a diffusion barrier after forming the via contact.

13. A method for forming a metal interconnection layer of a semiconductor device, the method comprising:

(a) sequentially forming a first insulating film and a first material film including a material selective to a medium used for removing a photoresist film;

(b) forming the photoresist film on the first material film having a pattern exposing a portion of the first material film;

(c) forming a via hole by etching the first material film and the first insulating film;

(d) transforming a portion of the first material film exposed to the via hole by reacting with the material used for removing the photoresist film and removing the photoresist film substantially simultaneously;

(e) forming, after step (d), an opening wider than the via hole in the first material film by removing a transformed portion of the first material film selectively;

(f) depositing a metal material to fill the via hole and the opening; and (g) forming a via contact by planarizing the semiconductor device to the first insulating film.

14. The method of claim 13, wherein the metal material includes copper.

15. The method of claim 13, wherein the method further comprises, forming a diffusion barrier after forming the opening.

16. The method of claim 13, wherein the first material film has a high selectivity to oxygen or oxygen ions.

17. The method of claim 13, wherein the first material film is an oxide film doped with carbon.

18. The method of claim 13, wherein the method further comprises, forming an interconnection pattern contacting the via contact and an interconnection layer including a second insulating film surrounding the interconnection pattern.

19. The method of claim 18, wherein the interconnection pattern of the interconnection layer comprises aluminum.

20. The method of claim 13, further comprises:
depositing an etch stopping layer on a semiconductor substrate before forming the first insulating film and
etching the etch stopping layer exposed to the via hole after step (e).

21. The method of claim 13, wherein the method further comprises, forming a diffusion barrier on the first insulating film exposed to the via contact hole before depositing the metal material.

22. The method of claim 1, wherein the removal of the portion of the first material film is performed after the removal of the photoresist film.

23. The method of claim 13, wherein the removal of the portion of the first material film is performed after the removal of the photoresist film.

* * * * *